United States Patent
Shahar et al.

(10) Patent No.: US 9,006,010 B2
(45) Date of Patent: Apr. 14, 2015

(54) RADIATION DETECTORS AND METHODS OF FABRICATING RADIATION DETECTORS

(75) Inventors: Arie Shahar, Moshav Magshimim (IL); Eliezer Traub, Ramat-Gan (IL); Diego Sclar, Ashdod (IL); Peter Rusian, Ashdod (IL)

(73) Assignee: General Electric Company, Schenectady, NY (US)

( * ) Notice: Subject to any disclaimer, the term of this patent is extended or adjusted under 35 U.S.C. 154(b) by 405 days.

(21) Appl. No.: 13/302,835

(22) Filed: Nov. 22, 2011

(65) Prior Publication Data

US 2013/0126998 A1 May 23, 2013

(51) Int. Cl.
*H01L 21/00* (2006.01)
*H01L 31/08* (2006.01)
*H01L 31/115* (2006.01)
*H01L 31/18* (2006.01)

(52) U.S. Cl.
CPC .......... *H01L 31/085* (2013.01); *H01L 31/115* (2013.01); *H01L 31/18* (2013.01); *Y10S 438/959* (2013.01)

(58) Field of Classification Search
CPC ............ H01L 21/32139; H01L 21/0337; H01L 21/30608; H01L 21/31144; H01L 21/76232
USPC ............ 438/57, 439, 959, 693, 40, 701, 713, 438/735, 738, 739; 257/428, 431, 623, 257/E21.237, E21.214, E21.219, E21.223, 257/E21.309
See application file for complete search history.

(56) References Cited

U.S. PATENT DOCUMENTS

| | | | |
|---|---|---|---|
| 6,121,622 A | 9/2000 | Beyne et al. | |
| 6,294,472 B1 * | 9/2001 | Smith et al. | 438/693 |
| 6,362,484 B1 | 3/2002 | Beyne et al. | |
| 6,528,814 B1 | 3/2003 | Frank et al. | |
| 7,410,606 B2 | 8/2008 | Appleby et al. | |
| 7,518,136 B2 | 4/2009 | Appleby et al. | |
| 2004/0098924 A1 * | 5/2004 | Iwasa | 51/302 |
| 2005/0032266 A1 * | 2/2005 | Suzuki | 438/50 |
| 2010/0193694 A1 * | 8/2010 | Chen et al. | 250/370.01 |

* cited by examiner

*Primary Examiner* — Davienne Monbleau
*Assistant Examiner* — Leslie Pilar Cruz
(74) *Attorney, Agent, or Firm* — Dean Small; The Small Patent Law Group, LLc.

(57) ABSTRACT

Radiation detectors and methods of fabricating radiation detectors are provided. One method includes mechanically polishing at least a first surface of a semiconductor wafer using a polishing sequence including a plurality of polishing steps, wherein a last polishing step of the polishing sequence includes polishing with a slurry having a grain size smaller than about 0.1 μm to create a polished first surface. The method also includes applying (i) an encapsulation layer on a top of the polished first surface to seal the polished first surface and (ii) a photoresist layer on top of the encapsulation layer on the polished first surface. The method further includes creating undercuts of the encapsulation layer under the photoresist layer. The method additionally includes partially etching the polished first surface of the semiconductor via the openings in the photoresist layer and in the encapsulation layer to partially etch the semiconductor creating etched regions.

20 Claims, 6 Drawing Sheets

RADIATION DETECTORS AND METHODS OF FABRICATING RADIATION DETECTORS

BACKGROUND OF THE INVENTION

The subject matter disclosed herein relates generally to radiation detectors and more specifically to radiation detectors for medical imaging, such as Nuclear Imaging (NI), Single Photon Emission Computed Tomography (SPECT), Positron Emission Tomography (PET) and Computed Tomography (CT).

Room temperature pixelated radiation detectors made of semiconductors, such as Cadmium Zinc Telluride (CdZnTe or CZT) semiconductors, have entered into the commercial phase in medical imaging. In this commercial phase, it is desirable for these detectors to exhibit high performance, especially with respect to energy resolution and sensitivity. In addition, these detectors, which are often the core technology integrated into camera heads of systems such as SPECT, PET and CT, should be stable, reliable and produced with high yield to reduce cost.

The radiation semiconductor detectors generally include two surfaces, one having a cathode monolithic electrical-contact applied thereto and another having surface pixelated anodes electrical contacts applied thereto. Prior to the application of the electrical contacts, the first and the second surfaces are etched by chemical wet etching. In CZT radiation detectors, the wet etching is done for at least two reasons: 1) to remove the mechanical damage from the surfaces introduced in previous fabrication steps where the semiconductor wafers of the detectors have been sliced and polished and 2) to create surfaces, which are tellurium rich, which is used to produce Ohmic contacts such as Indium contacts applied to CZT wafers.

The tellurium rich first surface on which the anodes contacts are applied have gap regions between the anodes contacts. The excess tellurium in the regions between the anodes causes these gaps to be of a relatively low surface resistance, which is also instable. The instability results in a reduction in the detector performances such as energy resolution and sensitivity, fabrication with relatively low production yield resulting in high cost detectors and unstable detectors with reduced reliability having quality degradation over time.

BRIEF DESCRIPTION OF THE INVENTION

In one embodiment, a method for fabricating a radiation detector is provided. The method includes mechanically polishing at least a first surface of a semiconductor wafer using a polishing sequence including a plurality of polishing steps, wherein a last polishing step of the polishing sequence includes polishing with a slurry having a grain size smaller than about 0.1 µm to create a polished first surface. The method also includes applying (i) an encapsulation layer on a top of the polished first surface to seal the polished first surface and (ii) a photoresist layer on top of the encapsulation layer on the polished first surface. The method further includes creating openings in the photoresist layer, partially etching the encapsulation layer via the openings in the photoresist layer to partially remove the encapsulation layer and creating undercuts of the encapsulation layer under the photoresist layer. The method additionally includes partially etching the polished first surface of the semiconductor via the openings in the photoresist layer and in the encapsulation layer to partially etch the semiconductor creating etched regions, in the first surface, having undercuts of the semiconductor under the encapsulation layer to produce non-etched gap-regions between the etched regions of the polished first surface. The method finally includes etching a second surface of the semiconductor, applying pixelated anode electrodes in the etched regions of the first surface and a monolithic cathode electrode on a second surface of the semiconductor, and removing the photoresist layer by a liftoff process.

In another embodiment, a method for fabricating an anode side of a radiation detector is provided. The method includes mechanically polishing at least a first surface of a semiconductor wafer using a plurality of polishing steps and forming etched regions and polished non-etched regions in the first surface, which are without chemical etching. The method also includes applying anode electrodes to the first surface, wherein the etched regions and the polished non-etched regions without chemical etching are between contacts formed by the applied anode electrodes.

In a further embodiment, a radiation detector is provided that includes a semiconductor and pixelated anode electrodes in etched regions on a first surface of the semiconductor, wherein the first surface in the regions between the anode electrodes is stoichiometric. The radiation detector also includes a monolithic cathode on a second surface of the semiconductor opposite the first surface.

DETAILED DESCRIPTION

The following detailed description of certain embodiments will be better understood when read in conjunction with the appended drawings. To the extent that the figures illustrate diagrams of the blocks of various embodiments, the blocks are not necessarily indicative of the division between hardware or components. Thus, for example, one or more of the blocks may be implemented in a single piece of hardware or component or multiple pieces of hardware or components. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Described herein are various embodiments for fabricating a radiation detector. By practicing at least one embodiment, higher quality radiation detectors having improved energy resolution and sensitivity may be provided. By practicing at least some embodiments an improved reliable process for fabricating radiation detectors may be provided having increased production yield that reduces the detector cost.

The radiation detectors of various embodiments are generally formed wherein a first surface that includes pixelated anodes is partially etched by chemical wet etching and in which the first surface of the radiation detector includes pixelated anodes under which the first surface is etched by chemical etching, wherein gaps between the pixelated anodes on the first surface are not etched by chemical wet etching. In various other embodiments, radiation detectors may be fabricated in which the first surface of the radiation detector includes pixelated anodes under which the first surface is etched by chemical etching and the gaps between the pixelated anodes on the first surface are gently polished mechanically to maintain a stoichiometric structure of the semiconductor material in these regions. Moreover, the gap regions between the anodes may be encapsulated by a protective layer to provide longer term stability of the detectors. The first surface of the radiation detector that includes pixelated anodes also may be fabricated using, for example, photolithography techniques including liftoff as described in more detail herein.

Additionally, in various embodiments, the first surface of the radiation detector includes pixelated anodes fabricated on regions in the first surface etched by chemical wet etching to improve electrical contact and to create undercut regions under the encapsulation layer. In various embodiments, an efficient and reliable liftoff process for improving production yield may result. In some embodiments, the fabrication process may be simplified by simultaneously etching the first and the second surface of the detectors wherein the first surface is etched partially only in the regions where the anodes are applied on the following fabrication step.

It should be noted that radiation detectors formed in accordance with various embodiments may be used, for example, in imaging systems to reconstruct or render an image. However, the term "reconstructing" or "rendering" an image or data set is not intended to exclude embodiments in which data representing an image is generated, but a viewable image is not. Therefore, when used, "image" broadly refers to both viewable images and data representing a viewable image that may be generated from data acquired by a radiation detector of one or more embodiments. One or more radiation detectors formed in accordance with various embodiments may be used to image an object, such as a human individual, another living creature besides a human individual, or inanimate objects, such as, but not limited to, luggage, shipping containers, and/or the like. However, in other embodiments, no image is generated or formatted and other data is acquired by the radiation detectors, such as spectral response data.

Figure 1:
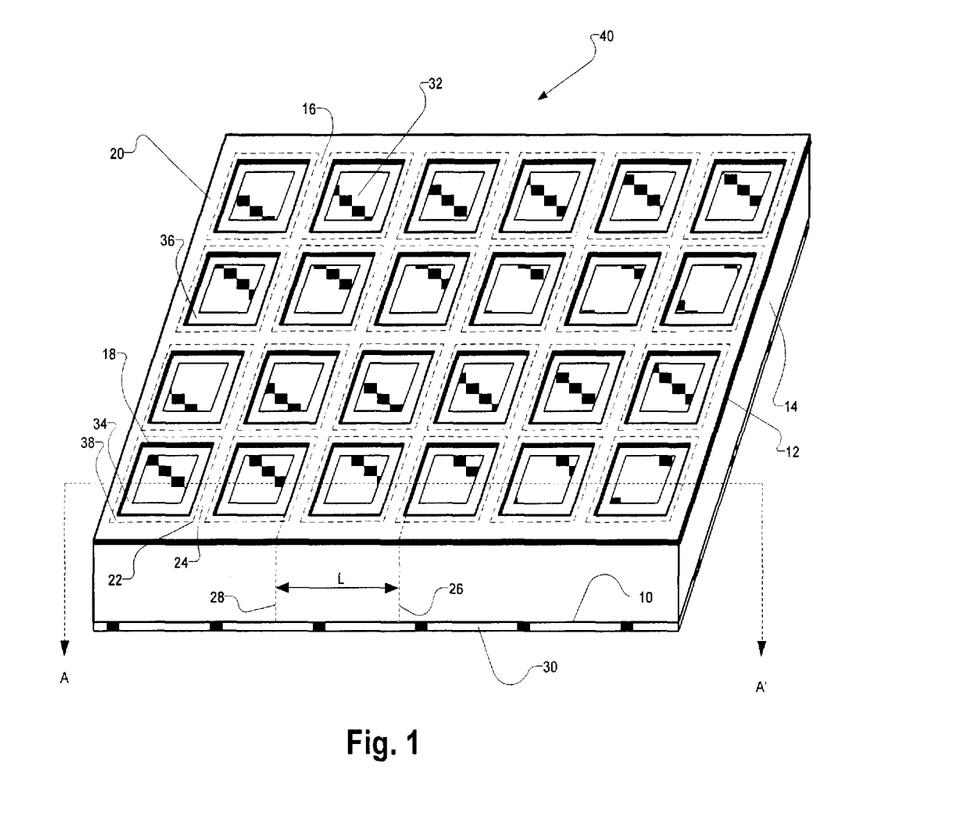
FIG. 1 is a schematic illustration of a radiation detector fabricated in accordance with various embodiments.

FIG. 1 is a schematic illustration of a perspective view of a radiation detector 40 designed and fabricated according to various embodiments. The detector 40 is formed from a semiconductor 14 (e.g., a semiconductor material) that may be, for example, a Cadmium Zinc Telluride (CdZnTe or CZT) semiconductor. The semiconductor 14 includes a first surface 12 on which pixelated anodes 32 are formed and a second surface 10 on which a monolithic cathode 30 is formed. An encapsulation or passivation layer 20 having openings 34, in which anodes 32 are formed, is deposited on top of the first surface 12. The layer 20 may be made, for example, of Zinc Sulfide (ZuS). Additionally, gaps 16 are formed, which are the spaces under the encapsulation layer 20 between the anodes 32.

Surfaces 36 of the semiconductor 14 under the anodes 32 are chemically etched via openings 34 in the layer 20, which can improve the quality of the electrical contact of the anodes 32 to the semiconductor 14 and also form undercut regions 38 (e.g., wedge shaped undercut regions), under the layer 20 between edges 18 of the openings 34 and the ends of the undercut regions 38 represented by the lines 22. As described below with respect to the fabrication process, the undercut regions 38 between the edges 18 of the openings 34 and the lines 22 facilitate a liftoff process used in the fabrication of the detector 40.

The pixelated anodes 32 and a monolithic cathode 30 in one embodiment are metal contacts that may be made, for example, of Indium (In), Gold (Au), Platinum (Pt), or Aluminum (Al), among other metals, or may be a stack of layers including some or all of these metals to produce Ohmic or blocking contacts. The gaps 24, which are the spaces under the encapsulation layer 20 between the undercut lines 22, are fabricated between the anodes 32 without using chemical wet etch in various embodiments.

It should be noted that a region L between the edges 18 of the openings 34 marked by lines 26 and 28 are illustrated in the various figures in a side-view cross-section of the detector 40 oriented along line AA'.

Figure 2:
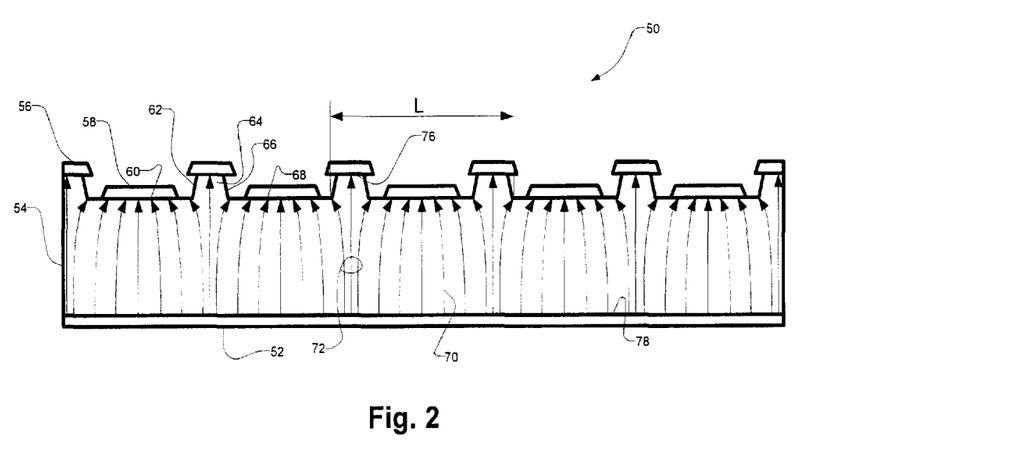
FIG. 2 is a diagram schematically illustrating the distribution of electrical-field lines in biased radiation detectors when gaps regions between the anodes are produced with wet chemical etching.
Figure 3:
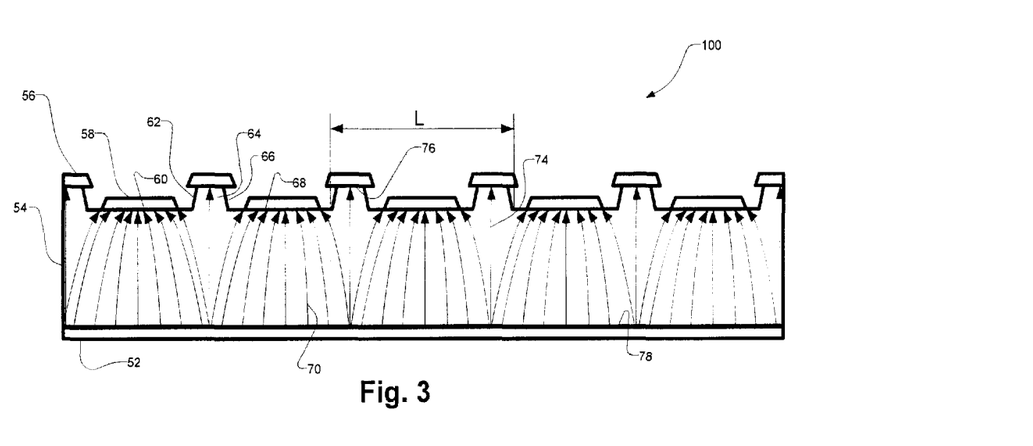
FIG. 3 is a diagram schematically illustrating the distribution of electrical-field lines in biased radiation detectors when the gaps regions between the anodes are produced without wet chemical etching in accordance with various embodiments.

FIGS. 2 and 3 illustrate a geometrical structure similar to the geometrical structure of the side-view cross-section of the detector 40 of FIG. 1 oriented along lines AA' of FIG. 1. It should be noted that the proportion and/or scale between the different elements of the detector 40 of FIG. 1 is different from the proportion and/or scale between the elements of the detectors 50 and 100 of FIGS. 2 and 3, respectively. Thus, even though the geometrical structures of the detectors 40, 50 and 100 of FIGS. 1-3 are similar, the above mentioned proportions and/or scales of FIGS. 2 and 3 are different from the proportion and/or scale of FIG. 1 to clarify the illustration of the elements of detectors 50 and 100 of FIGS. 2 and 3, respectively. It also should be understood that the detectors 40, 50 and 100 are schematically illustrated by FIG. 1-3, respectively and the proportions between the elements is not maintained to reflect the actual dimensions of the elements in these detectors.

More particularly, a monolithic cathode 52, semiconductor 54, encapsulation layer 56, pixelated anodes 58, surfaces 60 and 68 under anodes 58, undercuts regions 62 and 66 beneath a layer 56, gaps 64 between anodes 58, and an interval L of FIGS. 2 and 3 correspond to the monolithic cathode 30, semiconductor 14, encapsulation layer 20, pixelated anodes 32, surfaces 36 under the anodes 58, undercut regions 38 beneath the layer 20, gaps 24 between the anodes 32 and interval L of FIG. 1, respectively.

As described in more detail herein, while the radiation detectors 50 and 100 have similar geometrical structures, the fabrication processes for each are different. In particular, the detector 50 is produced such that gaps 64 between the anodes 58 are chemically etched before the encapsulation layer 56 is applied to the semiconductor 54 on top of the gaps 64. Unlike the detector 50, the detector 100 is produced such that gaps 64 between the anodes 58 are not chemically etched before the encapsulation layer 56 is applied to the semiconductor 54 on top of the gaps 64.

In various embodiments, the chemical etching of the surfaces 60 and 68 of the detector 50 and 100 is provided for:

1. Removing polishing mechanical-damage from the surfaces of the semiconductor 54 from which detector 50 is made; and 2. Creating non-stoichiometric surfaces 60, 68 and 78 of the semiconductor 54 under the anodes 58 and the cathode 52 having an excess of one of the components of the semiconductor 54, such as an excess of Tellurium (Te) when the semiconductor 54 is a CZT semiconductor and is chemically etched by Bromine Methanol or Bromine Ethylene Glycol. This non-stoichiometric surface with the excess of one of the elements of the semiconductor 54 can improve the quality of the electrical contacts of the anodes to the semiconductor 54.

The detector 50 of FIG. 2 includes gaps 64 between the anodes 58 having chemically etched surfaces 76 under the encapsulation layer 56. The surfaces 76 of the gaps 64 similar to surfaces 60, 68 and 78, are etched by a chemical wet process and thus, are non-stoichiometric surfaces including excess of one of the elements of semiconductor 54.

As described above, the excess of one of the elements of semiconductor 54, such as excess Te produced when the semiconductor 54 is a CZT semiconductor and is chemically etched by Bromine Methanol or Bromine Ethylene Glycol, is provided in surfaces 60, 68 and 78 so as to improve the quality of the electrical contacts between the semiconductor 54 and metal electrodes 58 and 76 formed on surfaces 60, 68 and 78 in various embodiments. However, this is not the case with the chemically etched surfaces 76 of the gaps 64 between the anodes 58 located under the encapsulation layer 56, for example, with the excess Te produced on the semiconductor 54 when etching the CZT semiconductor 54 by a chemical wet etch using Bromine Methanol or Bromine Ethylene Glycol. The presence of Te, Bromine ($Br_2$), Oxygen (O), Humidity ($H_2O$) and other materials that may be present on the surfaces 76 of thee gaps 64 between the anodes 58 of the detector 50 during the fabrication process of the detector 50, create a film or layer on top of the surfaces 76 that is made of a compound of at least part of the chemical materials described above.

The film or layer on top of the surfaces 76 has a resistivity that is relatively low in comparison to the resistivity of the bulk of the semiconductor 54. This low resistivity affects the line distribution of lines 70 of the electrical field that exist in the detector 50 when the detector 50 is electrically biased between the cathode 52 and the anodes 58, such as when the anodes 58 are biased with a voltage that is more positive than the voltage applied to the cathode 52.

The lower the resistivity of the layer produced by the wet chemical etch of the semiconductor 54 on top of the surfaces 76, the more lines 70 of the electric field are oriented toward the gaps 64. These lines 70 of the electrical field oriented toward the gaps 64 between the anodes 58 are identified as a group of lines 72.

In operation, photons that are detected and absorbed by the detector 50, produce charge carriers in the form of electrons and holes. In some of the events, the electrons drift along the electrical field lines 70 toward the anodes 58 to produce an electrical signal that is proportional to the energy of the photon absorbed and detected by the detector 50. In the events when the detected photons are absorbed in the detector 50 in regions beneath the gaps 64, the electrons produced by the absorption of the detected photons in the semiconductor 54 drift along the lines 72 toward the regions 64 between the anodes 58. The trajectories of the electron drift along the lines 72 create a transportation path of the electrons in which the electrons arrive at the surface 76 prior to collection of the electrons by the anodes 58.

When the electrons arrive at the surface 76, at least part of the electrons recombine at the surface 76 by surface recombination and only part of the electrons arrive at the anodes 58 and are collected at the anodes 58. When only part of the electrons arrives at the anodes 58, the charge collection by the anodes 58 is incomplete.

When the charge collection by the anodes 58 is incomplete, the performance of the detector, such as energy resolution and sensitivity can degrade, thereby resulting in a lower quality detector. The surfaces 76 of the gaps 64 between the anodes 58 of the detector 50 are chemically etched after being polished by a suitable (e.g., standard) mechanical process to remove the mechanical damage produced by the standard mechanical polish. The mechanical damage left after the mechanical polish reduces the resistivity of the surfaces 76 and increases the surface recombination of the electrons arriving to the surfaces 76 along the lines 72, resulting in strong incomplete charge collection by the anodes 58. Thus, the surfaces 76 have even lower resistivity than after the chemical etch if the surfaces 76 are left only with the mechanical polish without the chemical wet etch.

In addition to the incomplete charge collection by the anodes 58, the layer on top of the surfaces 76 under the encapsulation layer 56 produced by the chemical etch of the semiconductor 54 is chemically active even after the encapsulation by the encapsulation layer 56 and causes the detector 50 to further degrade with time. This degradation is due to further reduction in the resistivity of the layer on top of the surfaces 76 under the encapsulation layer 56, even after being installed in a system operating at a site (e.g., at a hospital).

Since the detector 50 has reduced quality, the number of detectors that can be fabricated to meet a certain specification is reduced as well. In this case, the production yield may be relatively low and the manufacturing cost relatively high, and also with the instability and reliability problems.

Accordingly, the detector 50 may have:

1. Reduced quality due to incomplete charge collection that degrades the energy resolution and sensitivity of the detector.

2. Instability and low reliability caused by the continuous chemical activity of the layer formed on top of the surfaces 76 under the encapsulation layer 56, by the wet chemical etching.

3. Relatively low production yield resulting at a relatively high manufacturing cost.

4. Relatively low commercial value.

The detector 100 of FIG. 3 is fabricated in accordance with other embodiments by a different approach. In the detector 100, the surfaces 76 are not chemically etched and are polished by non-standard polishing steps. In various embodiments, the top first surface of the detector 54 is very gently polished (as described in more detail herein) by a mechanical non-standard polish to leave the first top surface substantially damage free. In this case, the first top surface of the detector 100 is left without wet chemical etch since there is no need to remove the mechanical damage of the polish because there is substantially no damage in this surface.

Thus, without the chemical wet-etch, the first top surface of the detector 100 has a stoichiometric structure with no excess of one of the elements of the semiconductor in these surfaces. After the non-standard mechanical polish of the top first surface of the detector 100, this surface is partially etched, by chemical wet etch, to etch only the surfaces 60, 62, 66 and 68. The chemical etched in the regions 60, 62, 66 and 68 improves the electrical contact between the anodes 58 and the semiconductor 54. After the partial etch of the top first surface of the detector 100, the surfaces 76 on top of the regions 64 are left partially without being chemically etched and are processed only by the gentle non-standard mechanical polish.

In various embodiments, the surfaces 76 of the gaps 64 between the anodes 58 of the detector 100 are substantially damage free and without the relatively low-resistivity layer, which exists on the top of surfaces 76 of the detector 50 of FIG. 2, resulting in high resistivity gaps 64 between the anodes 58 of the detector 100.

Accordingly, the surfaces 76 have a resistivity that is similar to the resistivity of the bulk of the semiconductor 54 (also referred to as bulk resistivity). This relatively high resistivity affects the line distribution of the lines 70 of the electrical field in the detector 100 when electrically biased between the cathode 52 and the anodes 58, such as when the anodes 58 are biased with a voltage that is more positive than the voltage applied to the cathode 52.

The relatively high resistivity of the surfaces 76 of the gaps 64, produced by the gentle non-standard mechanical polish and without the wet chemical etch of the semiconductor 54 on top of the surfaces 76, reduces the number of lines 70 of the electric field, oriented toward the gaps 64, into substantially a single line 74. The single line 74 always exists due to the geometrical symmetry between biased anodes 58 and is independent of the resistivity of the surfaces 76.

In operation, photons that are detected and absorbed by the detector 100, produce charge carriers in the form of electrons and holes. The electrons drift along the electrical field lines 70 toward the anodes 58 to produce an electrical signal that is proportional to the energy of the photon absorbed and detected by the detector 100. Even in the event when the detected photons are absorbed in the detector 100 in regions beneath the gaps 64, most of the electrons produced by the absorption of the detected photons in the semiconductor 54 drift along the majority of the lines 70 toward the anodes 58 and few drift along the single line 74 toward the regions 64 between the anodes 58. The trajectories of the few electrons that drift along the single line 74 create a transportation path of the electrons in which the electrons arrive at the surface 76 prior to collection of the electrons by the anodes 58.

The few electrons that still arrive at the surfaces 76 suffer very low surface recombination because the surfaces 76, polished by the non-standard gentle polish, are substantially damage free, thus, electrons arriving at the anodes 58, via the surfaces 76, substantially do not suffer from incomplete charge collection by the anodes 58. Because few electrons arrive at the surfaces 76 prior to collection by the anodes 58 and because the few electrons that still arrive at the surfaces 76, along the single line 74, substantially do not suffer from surface recombination, the incomplete charge collection of the detector 100 is negligible in various embodiments.

When the charge collection by the anodes 58 of the detector 100 is substantially complete, the performance of the detector 100, such as energy resolution and sensitivity are improved in various embodiments and the detector has higher performance and is of higher quality. Various embodiments, thus, produce detectors 100 that meet a desired or required specification and enable high production yield at relatively low cost.

As described above, the surfaces 76 of the gaps 64 between the anodes 58 of the detector 100 are gently polished, by a non-standard polish process and even though the surfaces 76 are processed without chemical wet etched, the surfaces 76 are substantially damage free due to the gentle non-standard polish process. Thus, the detector 100 has no low-resistivity layer on top of the surfaces 76 under the encapsulation layer 56, which is chemically active even after the encapsulation, increasing the stability and reliability of the detector 100.

Thus, by practicing various embodiments, the detector 100 is provided that has:

1. High quality due to substantially complete charge collection that improves the energy resolution and sensitivity of the detector.
2. High stability and reliability caused by the gentle and non-standard mechanical polish of the surfaces 76, which is not followed by chemical etch and thus has no low resistivity and chemically active layer on top of the surfaces 76 under the encapsulation layer 56.
3. High production yield resulting in relatively low manufacturing cost.
4. High commercial value.

FIGS. 4-12 schematically illustrate the fabrication steps according to one embodiment for fabricating a detector, such as the detector 100 of FIG. 3. It should be noted that the same referral numerals are used in the various figures to describe similar parts. To clarify the figures and for ease of understanding of the fabrication steps of the detector schematically illustrated by FIGS. 4-12, the interval L shown in FIGS. 1-3 is magnified and substantially only this interval of the detector 100 of FIG. 3 is illustrated by FIGS. 4-12. It should be noted that even though FIGS. 3-12 illustrate the detector 100 with different schematic perspective views, the figures may show the detector 100 with different proportions between the various parts.

Figure 4:
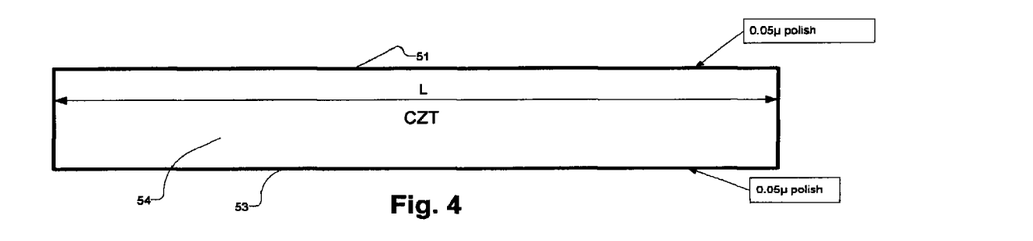
FIGS. 4-12 are diagrams illustrating the fabrication steps involved in the production of radiation detectors according to various embodiments.

FIG. 4 schematically shows the semiconductor 54 that may be made of a CZT wafer having a width L, a first top surface 51 and a second lower surface 51 In the first fabrication step of the detector 100 as shown in FIG. 4, the first and second surfaces 51 and 53 of the semiconductor 54 are mechanically polished in a process that may include double side polishing or side by side polish. The polishing includes several polishing steps in which each successive polishing step is performed with a slurry having grains, such as alumina, silica or silicon carbide grains, which are smaller than the grains in the slurry of the previous polishing step. In each polishing step of the semiconductor wafer 54, the mechanical damage left in the surface of semiconductor 54, after the polish step, is proportional to the grain size in the slurry used in this polishing step.

The sequence of polishing steps is provided to remove the mechanical damage of the previous polishing step by the next polishing step while the damage left in the first and second surfaces 51 and 53 of the semiconductor 54 after the next polishing step is smaller than the corresponding damage left in the surfaces 51 and 53 of the semiconductor wafer 54 after the previous polishing step because the next step includes a slurry with smaller grains. Accordingly, the mechanical damage in the surfaces 51 and 53 reduces with the amount of steps in the sequence of the polishing process in various embodiments.

The detector 100 is, thus, fabricated by polishing and etching methods described below. In particular, in one embodiment, in the fabrication process of the detector 100 of FIG. 3, the semiconductor wafer 54 of FIG. 4 is polished with a longer polishing sequence including more polishing steps, such as that are used in the polishing sequence of the detector 50. For example, in various embodiments, four polishing steps are performed with the last step in the sequence of the polishing steps of the detector 100 including a slurry with a grain size less than 0.1 µm, for example, a grain size of 0.05 µm. In one embodiment, the sequence of polishing includes the use of a series of slurries having grain sizes of 9 µm, 1 µm, 0.6 µm and 0.05 µm in polishing steps 1 to 4, respectively.

The small size of the grains involved in the polishing of the surfaces 51 and 53 of wafer 54 of FIG. 4, leaves these surfaces substantially damage free with a resistivity that is similar to the resistivity of the bulk of the semiconductor wafer 54. In this process of fabricating the detector 100, the surfaces 76 above the gaps 64 between the anodes 58 of FIG. 3 have a resistivity that is very high and is suitable to produce the detectors 100 without chemical etching of the surfaces 76 of FIG. 3 and as shown in FIG. 4.

Figure 5:
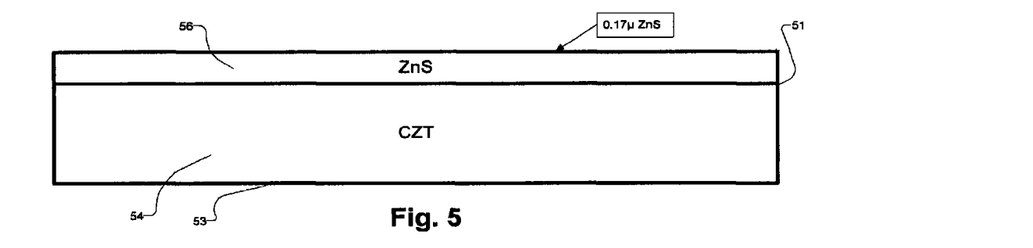

FIG. 5 schematically illustrates the semiconductor wafer 54 in the second step of fabricating the detector 100. In this step, the encapsulation layer 56 is applied to the first surface 51 of the wafer 54 in a process that may include, for example, evaporation, spattering or deposition of the encapsulation layer 56 on the surface 51. In one embodiment, where the wafer 54 is made of a CZT semiconductor, the encapsulation layer 56 may be made of Zinc Sulfide (ZnS). The encapsulation layer 56 protects and seals the first surface 51 from being exposed to contamination and humidity that may cause resistivity reduction of the surfaces 76 on top of the gaps 64 under the layer 56 of FIG. 3.

The encapsulation layer 56 generally has a good adhesion to the surface 51 of the wafer 54 with a lattice constant similar to the lattice constant of the semiconductor wafer 54. The lattice match between the encapsulation layer 56 and the semiconductor wafer 54 reduces the stress in the interface between the layer 56 and the surface 51 of the wafer 54. Such stress may cause damage to the surface 51, which may result in an undesired reduction of the resistivity of the surface 51. Accordingly for example, the ZnS layer 56 is used for the encapsulation of the CZT wafer 54 as the lattice constant of each is similar and a close match. To further reduce the stress between the CZT wafer 54 and the encapsulation ZnS layer 56, the encapsulation layer 56 may be formed with a thickness that allows the encapsulation layer 56 to be stretched along the surface 51 to reduce the stress in the interface between the layer 56 and the surface 51 of the CZT wafer 54. For example, in the process illustrated by FIG. 5, the thickness of the ZnS layer 56 on the CZT wafer 54 may be about 0.17 µm. However, other thicknesses may be used.

Figure 6:
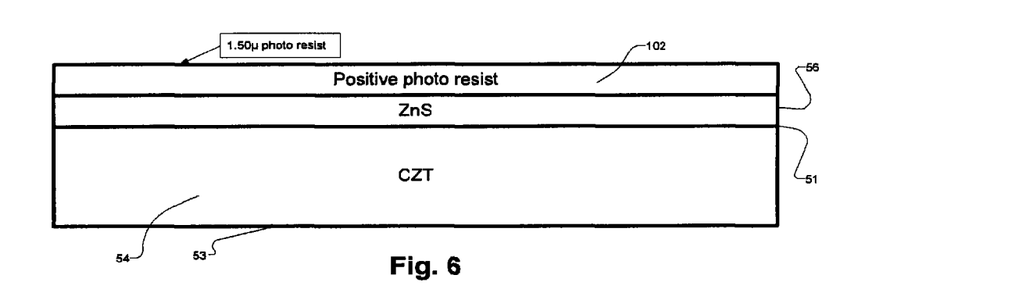

FIG. 6 is schematic illustration of the third step in fabricating the detector 100. In this step, a photoresist layer 102 is applied on top of the encapsulation layer 56 to form a patterned photoresist layer using UV irradiation through a patterning mask. The photoresist layer 102 may be of a positive or negative type and generally has good adhesion to the layer 56. The thickness of the photoresist layer 102 is thin enough in various embodiments to allow patterning of the layer and thick enough to ensure effective liftoff process in another processing step as is described below in connection with FIG. 12. For example, FIG. 6 illustrates the photoresist layer 102 as being of a positive type with thickness of 1.5 µm, which is spread over the layer 56 using a spinner to spin the wafer 54. However, other thickness may be used.

Figure 7:
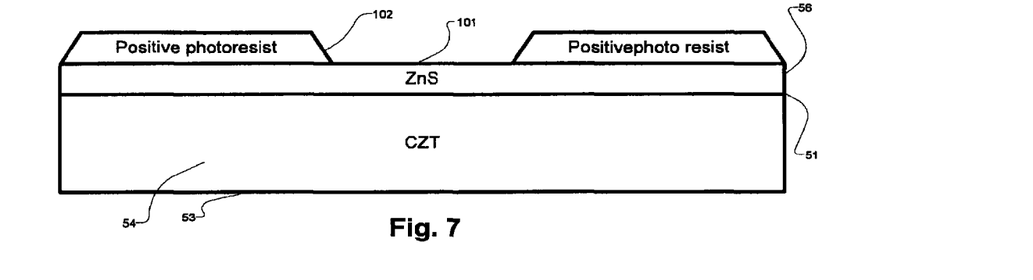

FIG. 7 schematically illustrates the fourth step in fabricating the detector 100. After the third fabrication step of the detector 100 and prior to this fabrication, the photoresist layer 102 is exposed to patterned UV illumination via a patterning mask using, for example, a suitable mask-aligner system and is backed in a furnace to produce soft backing of the photoresist layer 102. In the fourth fabrication step illustrated by FIG. 7, the photoresist layer 102 is developed and parts of the photoresist layer 102 are removed according to the patterned UV illumination of the layer 102 in the mask-aligner system using photolithography techniques to form openings 101 in the photoresist layer 102 above the encapsulation layer 56. After this step, the photoresist layer 102 is hardly backed making the photoresist layer 102 resistable to acids.

Figure 8:
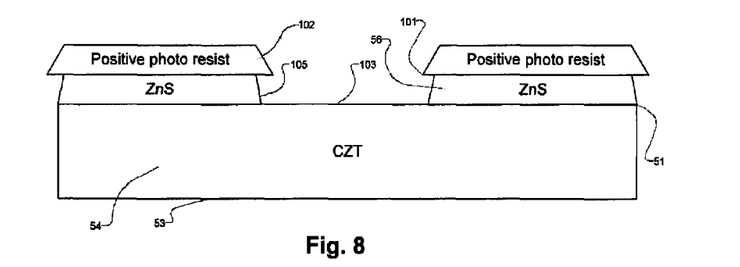

FIG. 8 is a schematic illustration of the fifth fabrication step of the detector 100. In this step, the encapsulation layer 56 is etched via the openings 101 in the photoresist layer 102 to form openings 103 in the encapsulation layer 56. The etching of the layer 56 may be performed, for example, by a dry-etch process, such as ion-milling or by chemical wet etch. When wet chemical etching is used to produce the openings 103 in the layer 56, in various embodiments a selective etchant that etches only the layer 56 and substantially does not etch the semiconductor 54 or etch the semiconductor wafer 54 very slowly is used. In this case, the surface 51 of the semiconductor wafer 54 is a stop etch surface where the etching stops. In this embodiment, the etching of the layer 56 may be better controlled and the wafer 54 is substantially not etched.

For example, when the wafer 54 is a CZT wafer and the encapsulation layer 56 is made of ZnS, the selective etchant used to etch the layer 56, via the openings 101, to form the openings 103 in the encapsulation layer 56 in one embodiment is HCl. During the formation of the openings 103 in the ZnS layer 56, the CZT wafer 54 is not etched and the undercut 105 in the encapsulation layer 56 is formed under the photoresist layer 102.

Figure 9:
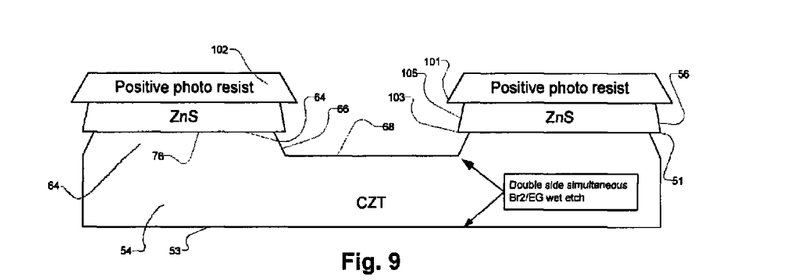

FIG. 9 schematically illustrates the sixth fabrication step used to produce the detector 100. In this fabrication step the semiconductor wafer 54 is etched, via the openings 101 in the photoresist 102 and the openings 103 in the encapsulation layer 56 to produce the etched regions 68 having the undercuts 66 under the encapsulation layer 56. In one embodiment, a selective etchant is used that does not attack the photoresist layer 102 and does not etch the encapsulation layer 56. Accordingly, the etching of the wafer 54 may be more controlled and accurate. For example, when the wafer 54 is made of CZT, the layer 102 is made of a photoresist and the layer 56 is made of ZnS, the selective etchant may be Bromine Methanol, $Br_2HBr$ or Bromine Ethylene Glycol, which etch the CZT wafer and do not attack the layers 102 and 56.

Figure 11:
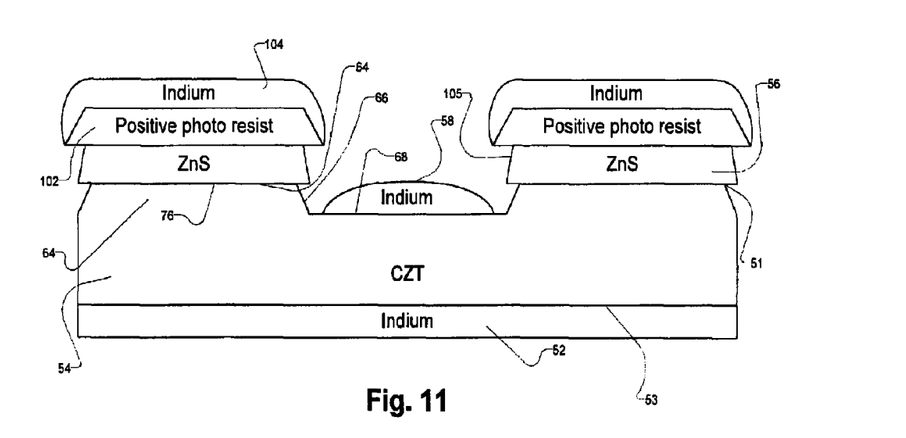

As described above in connection with FIGS. 1 and 2, the chemical wet etching of the surfaces 68 of detector 100, as shown in FIG. 9, is performed for creating the non-stoichiometric surface 68 of the semiconductor wafer 54 under the anodes 58 and the cathode 52 (as shown in FIG. 11) having excess of one of the components of the semiconductor 54. For example, such excess of Te is created when the semiconductor 54 is a CZT semiconductor and is chemically etched by Bromine Methanol or Bromine Ethylene Glycol. This non-stoichiometric surface with the excess of one of the elements of the semiconductor 54 improves the quality of the electrical contacts of the anodes 58 and the cathode 52 (shown in FIG. 11) to the semiconductor 54.

The regions 68 of the surface 51 and the surface 53 under cathode 52 are etched from the wafer 54. The surface 53 on which the cathode 52 is formed (shown in FIG. 11), may be etched simultaneously with the surface 51 or at a later fabrication step (e.g., sequentially or concurrently)

Figure 12:
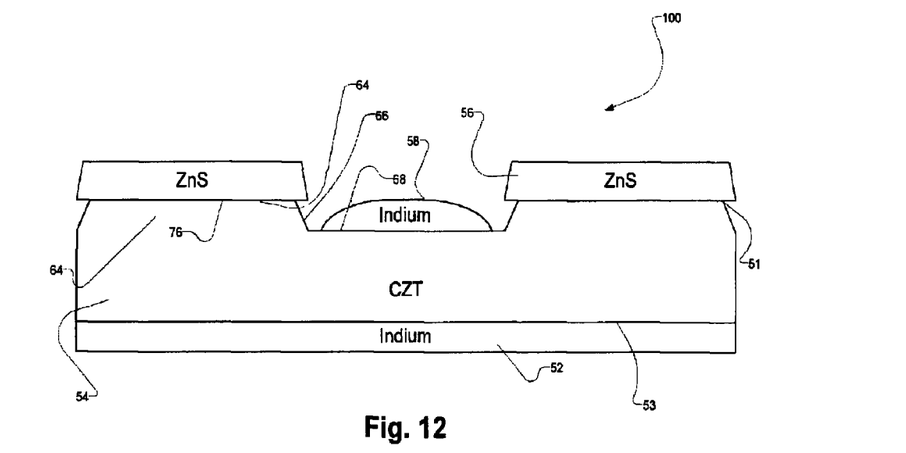

The surfaces 68 of the semiconductor 54 under the anodes 58 of the detector 100 are chemically etched via the openings 103 in the layer 56 to form the undercut regions 66, under the layer 56. As described below, with respect to the fabrication process, the undercut regions 66 at the edges of the regions 68 allow for a liftoff process used in the fabrication of the detector 100 as shown in FIGS. 11 and 12.

The partial etch of the regions 68 from the surface 51 of the wafer 54 is done only via the openings 101 and 103 of the layers 102 and 56, respectively in various embodiments. In these embodiments, the surfaces 76 on the gaps 64 between the regions 68 are left without chemical wet etching and thus have a surface resistivity corresponding to the gentle non-standard mechanical polish of the surfaces 76, which is similar to the resistivity of the bulk of the wafer 54.

Figure 10:
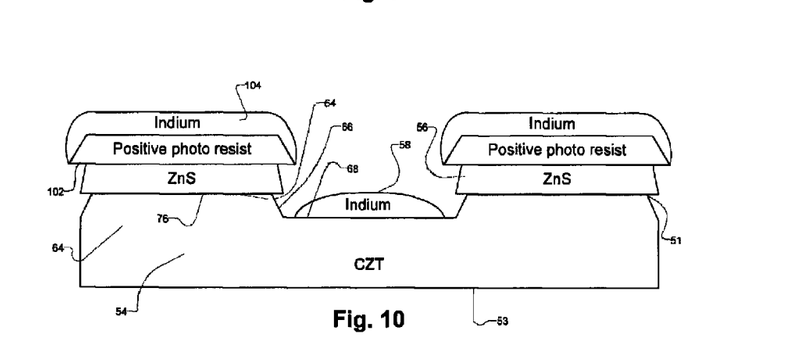

FIG. 10 is a schematic illustration of the seventh fabrication step of the detector 100. In this fabrication step, the anodes 58 are formed on the regions 68. Forming the metal contact of the anodes 58 may be done, for example, by metal evaporation using a heated crucible or c-gun, metal spattering, electroplating or electroless processes, among others. As described above the metals used to form the anodes 58 may be In, Au, Pt, Al, among others, or a stack of layers including some or all of these metals. The type of metals used may determine whether the produced electrical contacts are Ohmic or blocking contacts.

For example, FIG. 10 shows the anodes 58 formed by evaporation of In all over the top surface of the CZT wafer 54. In one embodiment, the In layer 104 is formed on top of the photoresist layer 102 and the anodes 58 are formed on the etched regions 68. In this embodiment, the In anode contacts on the CZT wafer 54 create an electrical Ohmic contact.

It should be noted that the anodes 58 are part of In layer 104. It can be seen that the anodes 58 and the In layer 104 are not connected due to the undercut 105 (as shown in FIG. 9) of the layer 56 under the layer 102 and the undercut 66 of the wafer 54 under the layer 56. The discontinuity between the layer 104 and the anodes 58 is formed by the shadowing effect of the undercuts 105 and 66 that block the evaporation paths in the intervals between the layer 104 and the anodes 58. The existence of the undercuts 105 and 66 that produces the discontinuity between the In layer 104 and the anodes 58 is useful in the liftoff process as illustrated by FIGS. 11 and 12 and as described below.

FIG. 11 schematically illustrates the eight fabrication step of the detector 100. In this fabrication step, the cathode 52 is applied to the surface 53 of the semiconductor wafer 54. As described above, the cathode 52 may be applied to the etched surface 53 after the top and lower surfaces 51 and 53 are etched simultaneously or after the surfaces 51 and 53 are etched in different fabrication steps, such as the steps illustrated by FIGS. 9 and 11, respectively. The cathode 52 is applied on the surface 53 that, due to its chemical etching, is non-stoichiometric and is rich with one of the elements of the semiconductor 54 to improve the electrical contact of the cathode 52 to the surface 53 of the semiconductor wafer 54.

When the formation of the pixelated anodes 58 and the monolithic cathode 52 are produced by a metallization process including electroplating or electroless, both the anodes 58 and the cathode 52 may be formed simultaneously on both sides of the wafer 54 in the top first surface 51 and the lower surface 53. If an evaporation process is used to form the pixelated anodes 58 and the monolithic cathode 52, the anodes 58 and the cathode 52 may be formed at different fabrication steps, such as the fabrication steps shown in FIGS. 10 and 11, respectively. For example, the application of the In cathode 52 shown in FIG. 11 is performed by an evaporation process. In the examples illustrated by FIGS. 10 and 11, the thickness of In layers of the anodes 58 and the cathode 52 in one embodiment may be about 0.34 μm. However, different thicknesses may be used.

FIG. 12 is a schematic illustration of the detector 100 having a structure similar to the detector 40 schematically illustrated in FIG. 1. FIG. 12 schematically illustrates the ninth fabrication step of the detector 100. In this fabrication step, the liftoff process is conducted to remove the In layer 104 (shown in FIG. 10) and the photoresist layer 102 from the encapsulation layer 56. During the liftoff process the photoresist layer 102 is exposed, for example, to Acetone that causes the layer 102 to be swollen first and later to be dissolved in the Acetone to be washed out together with the In layer 104. The efficiency of the liftoff process is increased due to the undercut 105 in the encapsulation layer 56 under the photoresist layer 102 and mainly due to the undercut 66 in the semiconductor 54 under the layer 56. These undercuts allow free access of the Acetone, via the discontinuity between the layer 104 and the anodes 58, to reach the photoresist layer 102 for being swollen and dissolved for removing the In layer 104. Thus, the creation of the undercuts 105 and 66 facilitate achieving an efficient liftoff process to assure fabrication of detector 100, such as with high production yield.

As described above, the discontinuity between the layer 104 and the anodes 58, which is used for the liftoff process, is formed by the shadowing effect of the undercuts 105 and 66 that block the evaporation paths in the intervals between the layer 104 and anodes 58. The existence of the undercuts 105 and 66 that produces the discontinuity between the In layer 104 and the anodes 58 facilitates the liftoff process as illustrated by FIGS. 11 and 12 as described above.

Figure 13:
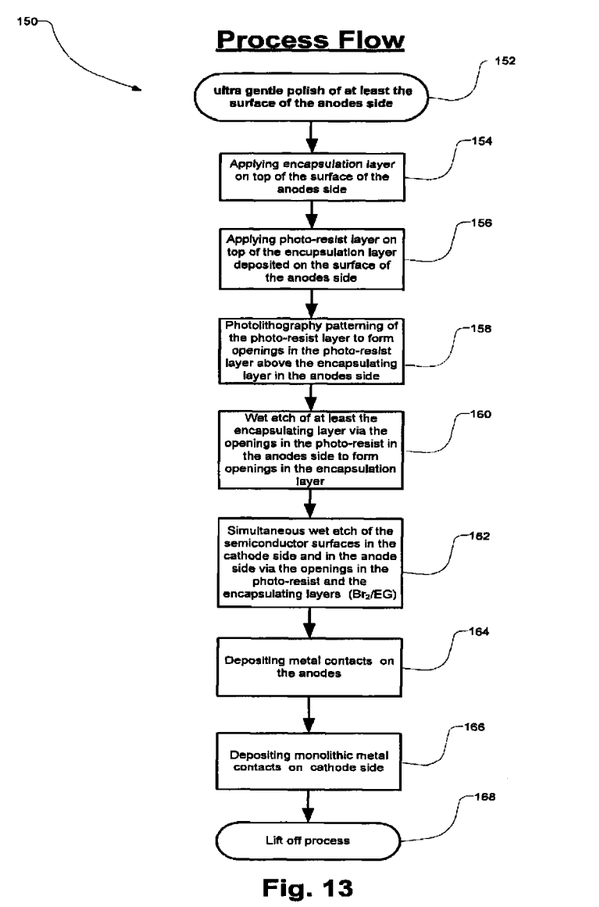
FIG. 13 is a flow chart of a method for fabricating radiation detectors in accordance with various embodiments.

FIG. 13 is a process flowchart illustrating and describing the processing steps in the fabrication sequence of a detector, for example, the detector 100 illustrated by FIGS. 4-12. The fabrication steps illustrated by FIGS. 4-12 (which in the illustrated embodiment include nine steps) correspond to the steps 152-168 illustrated by the flowchart 150 as described in more detail above. In general, a gentle polish at 152 is followed by the application of an encapsulation layer at 154 on the top of the surface of the anode side. A photoresist layer is applied at 156 on top of the encapsulation layer, which is deposited on the surface of the anode side. Photolithography patterning of the photoresist layer is then performed at 158 to form openings in the photoresist layer above the encapsulation layer in the anode side.

A wet etching of at least the encapsulation layer via the openings in the photoresist in the anode side is then performed at 160 to form openings in the encapsulation layer. A simultaneous or concurrent wet etch of the semiconductor surfaces in the cathode side and the anode side via the opening in the photoresist and the encapsulation layers is then performed at 162. Metal contacts are then deposited on the anodes at 164 and monolithic metal contacts are deposited in the cathode side at 166. A lift off process in the performed at 168.

Accordingly, by practicing various embodiments a detector may be fabricated with an efficient fabrication process due to a high production yield achieved. The formation of the undercuts 105 and 66 facilitate the fabrication process. The gentle non-standard polishing together with the partially etched top first surface 51 produce the gaps 64 having the high resistivity surfaces 76 with a resistivity similar to the resistivity of the bulk of the semiconductor 54 resulting in a higher performance radiation detector produced with high production yield at relatively low cost.

Variations and modifications are contemplated. For example, although the semiconductor 54 in various embodiments is described as being a CZT semiconductor, the semiconductor may be formed from any suitable material. Additionally, although the anodes 58 and the cathode 52 are described as made of In, the anodes 58 and the cathode 52 may be formed from any type of material, particularly any type of metal. Moreover, although the electrical contacts of the anodes 58 and the cathode 52 are described as Ohmic contacts, the electrical contacts may be other types of contacts, such as blocking contacts. Also, although the first and second surfaces 51 and 53 of the semiconductor 54 are described as being polished simultaneously in the same fabrication step, the first and second surfaces 51 and 53 may be polished at different fabrication steps, which may or may not be concurrent.

Additionally, although the anodes 58 and the cathode 52 are described as being produced in different fabrication steps, they may be formed simultaneously or currently at the same fabrication step. Further, although the grains in the slurry used in the last polishing steps are described in one embodiment as having a size of 0.05 μm, these grains may have any size, such as less than 0.1 μm. Also, the size of the grains of the slurry of the various polishing steps may have any size.

Thus, various embodiments provide methods for fabricating a radiation detector, such as a pixelated radiation detector without chemical etching to remove damaged layers. Accordingly, in various embodiments, no chemical etching is used between the anode contacts.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, the embodiments are by no means limiting and are exemplary embodiments. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A method for fabricating a radiation detector, the method comprising:
    mechanically polishing at least a first surface of a semiconductor wafer using a polishing sequence including a plurality of polishing steps, wherein a last polishing step of the polishing sequence includes polishing with a slurry having a grain size smaller than about 0.1 μm to create a polished first surface;
    applying (i) an encapsulation layer on a top of the polished first surface to seal the polished first surface and (ii) a photoresist layer on top of the encapsulation layer on the polished first surface;
    creating openings in the photoresist layer;
    partially etching the encapsulation layer via the openings in the photoresist layer to partially remove the encapsulation layer and creating undercuts of the encapsulation layer under the photoresist layer;
    partially etching the polished first surface of the semiconductor wafer via the openings in the photoresist layer and in the encapsulation layer to partially etch the semiconductor wafer creating etched regions, in the first surface, having undercuts of the semiconductor wafer under the encapsulation layer to produce non-etched gap regions between the etched regions of the polished first surface;
    etching a second surface of the semiconductor wafer;
    applying pixelated anode electrodes in the etched regions of the polished first surface and a monolithic cathode electrode on a second surface of the semiconductor wafer; and
    removing the photoresist layer by a liftoff process.

2. The method of claim 1, wherein the polishing forms the polished first surface having a resistivity substantially the same as a bulk resistivity of the semiconductor wafer.

3. The method of claim 1, wherein applying the photoresist layer comprises using photolithography.

4. The method of claim 1, wherein the partial etching forms the gap regions having a resistivity substantially the same as a bulk resistivity of the semiconductor wafer.

5. The method of claim 1, wherein the partial etching produces in the etched regions a semiconductor rich with a semiconductor component.

6. The method of claim 1, wherein the etching of the second surface produces in the etched regions a semiconductor rich with a semiconductor component.

7. The method of claim 1, wherein the semiconductor wafer comprises Cadmium Zinc Telluride.

8. The method of claim 7, wherein the encapsulation layer comprises Zinc Sulfide.

9. The method of claim 1, wherein the pixelated anode electrodes and the cathode electrode are formed from a metal, the metal being at least one of Indium, Gold, Platinum or Aluminum.

10. The method of claim 1, wherein the pixelated anode electrodes and the cathode electrode are applied to the semiconductor wafer by a processing technique including one of evaporation, spattering, electroplating or electro-less plating.

11. The method of claim 1, wherein the pixelated anode electrodes and the cathode electrode produced with said semiconductor wafer are formed from electrical contacts being one of Ohmic contacts or blocking contacts.

12. The method of claim 1, wherein the first and second surfaces of the semiconductor wafer are polished simultaneously in a same fabrication step.

13. The method of claim 1, wherein the first and second surfaces of the semiconductor wafer are polished in a plurality of different fabrication steps.

14. The method of claim 1, wherein the first and second surfaces of the semiconductor wafer are etched simultaneously in a same fabrication step.

15. The method of claim 1, wherein the first and second surfaces of the semiconductor wafer are etched in a plurality of different fabrication steps.

16. The method of claim 1, wherein the pixelated anode electrodes and the cathode electrode are applied to the semiconductor wafer simultaneously in a same fabrication step.

17. The method of claim 1, wherein the pixelated anode electrodes and the cathode electrode are applied to the semiconductor wafer in a plurality of different fabrication steps.

18. The method of claim 1, wherein (i) partially etching the polished first surface of the semiconductor wafer via the openings in the photoresist layer and in the encapsulation layer and (ii) etching the second surface of the semiconductor wafer are performed simultaneously is one step.

19. The method of claim 1, wherein the photoresist comprises one of a positive photoresist and a negative photoresist.

20. The method claim of claim 1, wherein the last polishing step includes a slurry having grain size of about 0.05 μm.

\* \* \* \* \*